United States Patent [19]

Claisse et al.

[11] Patent Number: 5,703,892

[45] Date of Patent: Dec. 30, 1997

[54] METHOD OF MODE DETECTION AND CONTROL IN SEMICONDUCTOR LASERS

[75] Inventors: Paul Claisse; Philip Kiely, both of Gilbert, Ariz.

[73] Assignee: Motorola, Inc., Schaumburg, Ill.

[21] Appl. No.: 692,003

[22] Filed: Jul. 1, 1996

[51] Int. Cl.$^6$ ..................................... H01S 3/10

[52] U.S. Cl. ................ 372/32; 372/19; 372/50; 372/96

[58] Field of Search ................... 372/96, 29, 32, 372/19, 50

[56] References Cited

U.S. PATENT DOCUMENTS

| | | | |
|---|---|---|---|
| 5,381,230 | 1/1995 | Blake et al. | 372/32 |
| 5,438,578 | 8/1995 | Lee et al. | 372/32 |
| 5,577,064 | 11/1996 | Swirhun et al. | 372/96 |

Primary Examiner—James W. Davie
Attorney, Agent, or Firm—Eugene A. Parsons

[57] ABSTRACT

A method of controlling the spatial mode of the output of a semiconductor laser including the steps of monitoring above threshold spontaneous emissions of a semiconductor laser. Identifying a point at which the rate-of-change, or the slope, of spontaneous emissions versus drive current abruptly changes. Employing feedback to maintain spatial mode control.

9 Claims, 2 Drawing Sheets

METHOD OF MODE DETECTION AND CONTROL IN SEMICONDUCTOR LASERS

FIELD OF THE INVENTION

This invention relates to semiconductor lasers and more specifically to monitoring and controlling the operation of semiconductor lasers.

BACKGROUND OF THE INVENTION

Semiconductor lasers, such as vertical cavity surface emitting lasers (VCSEL) and edge emitting lasers are well known, and are formed in a wide variety of configurations. The basis for VCSELs in virtually all configurations is an active area sandwiched between two mirror stacks. The laser is activated by driving an electrical current through the two mirror stacks and the active area. This is generally accomplished by placing a first electrode across the mirror stack at one end of the laser and a second electrode across the other mirror stack at the other end of the laser. One of the electrodes generally defines a central opening therethrough for the emission of light.

For many applications a VCSEL having an output with a single spatial mode is required. Single spatial mode output has been achieved by designing VCSELs which are capable of operating in only one spatial mode. As an example, many devices employ a mesa through which the current is injected. The mesa is formed of a size closely corresponding to the optical mode. In this manner, injection of current into the active region is limited to a specific area corresponding to the desired spatial mode. This and other methods of providing an output with a single spatial mode requires fine lithography and well controlled processing. These processing concerns increase time and cost of production.

Edge emitting lasers typically consist of a flat junction of two pieces of semiconductor material each having been treated with a different type of impurity. When a large electrical current is passed through such a device, laser light emerges from the plane of the junction region. The problem is maintaining a single spatial mode with fluctuations in temperature and natural deterioration of the device.

It would be highly advantageous, therefore, to remedy the foregoing and other deficiencies inherent in the prior art.

Accordingly, it is an object of the present invention to provide a method of determining a shift in the spatial mode of the output of a semiconductor laser.

Another object of the invention is to provide a method enabling control of the spatial mode of a semiconductor laser.

And another object of the invention is to provide a method of obtaining a single spatial mode output from a multi-mode semiconductor laser.

SUMMARY OF THE INVENTION

Briefly, to achieve the desired objects of the instant invention in accordance with a preferred embodiment thereof, provided is a method of determining the spatial mode in which a semiconductor laser is operating. The method includes the steps of monitoring spontaneous emissions versus drive current of a semiconductor laser and identifying a point above a threshold current at which the rate-of-change of the spontaneous emissions versus drive current abruptly changes.

In a further method of controlling the spatial mode of the output of a semiconductor laser the steps include providing a semiconductor laser. Positioning a detector adjacent the semiconductor laser for receiving spontaneous emissions from the semiconductor laser at an above threshold current. Monitoring the spontaneous emissions of the semiconductor laser emitted above threshold current. Identifying a point above a threshold current at which the rate-of-change of the spontaneous emissions versus drive current abruptly changes, and employing feedback to maintain spatial mode control.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
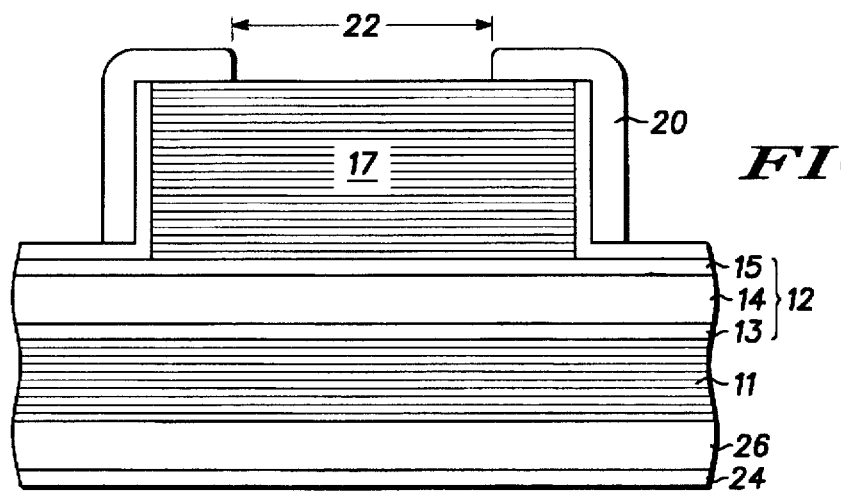
FIG. 1 is a partial sectional view of a conventional vertical cavity surface emitting laser.

Turning now to the drawings in which like reference characters indicate corresponding elements throughout the several views, attention is first directed to FIG. 1 which illustrates a vertical cavity surface emitting laser (VCSEL) generally designated 10. VCSEL 10 includes a first mirror stack 11, an active region 12 having a first cladding layer 13, an active layer 14 (such as one or more quantum wells and the like) and a second cladding layer 15, and a second mirror stack 17. Second mirror stack 17 is etched, or selectively deposited, to form a mesa-like structure. An electrical contact 20 is formed in contact with at least the upper end of second mirror stack 17. Electrical contact 20 defines a window 22 for the emission of light from VCSEL 10 through second mirror stack 17. A second electrical contact 24 is positioned over the lower surface of first mirror stack 11, typically on the opposing surface of a substrate 26 upon which the device is formed.

An operating voltage applied across contacts 20 and 24 produces a current flow through VCSEL 10 which produces the lasing action as is well known. In general, because of the position of electrical contact 20 on the surface of second mirror stack 17, current flows throughout the mesa-like structure of second mirror stack 17 and lasing is supported wherever current flows. Since current outside the optical mode is wasted and may even interfere with proper operation of the VCSEL, typically, the diametric size of the mesa is dependent upon the mode of operation of the VCSEL, with the diameter closely matching the mode of operation. In this manner, current flow is generally limited to the mode of operation. The problem is that series resistance is increased, and providing an output with a single spatial mode requires fine lithography and well controlled processing which is expensive and time consuming.

Figure 2:
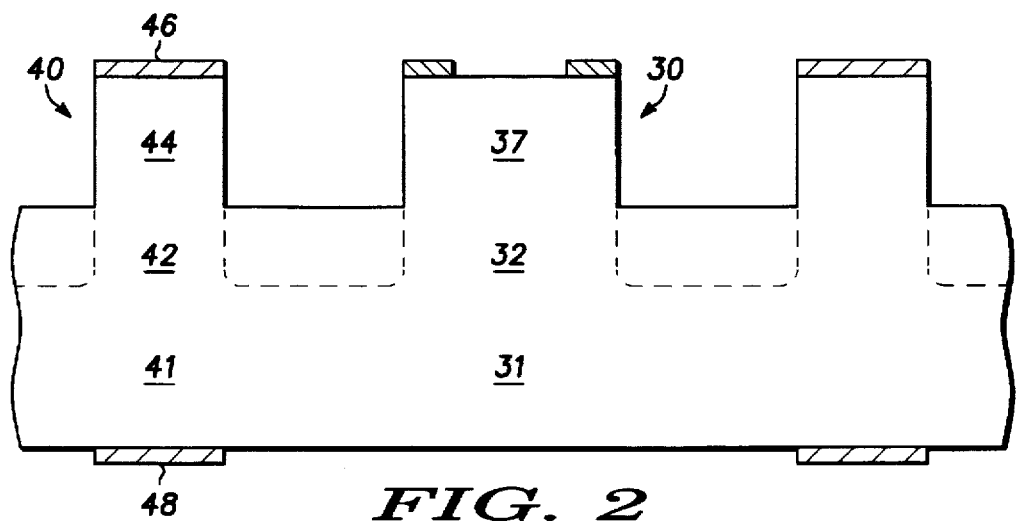
FIG. 2 is a partial sectional view of a vertical cavity surface emitting laser and lateral detector.

Referring to FIG. 2, a vertical cavity surface emitting laser 30 (VCSEL) embodying the present invention is illustrated. VCSEL 30 includes a first mirror stack 31, an active region 32, and a second mirror stack 37. Second mirror stack 37 is etched, or selectively deposited to form a mesa-like structure, as described above. However, in the present invention, the series resistance of VCSEL 30 is lowered by increasing the diametric size of second mirror stack 37. Increasing the diametric size of the mesa-like structure greatly reduces resistance, but also allows current flow into active region 32 outside the fundamental optical mode, in effect providing a multi-mode device. To control the current flow into active region 32, a feed back circuit is employed to provide the correct current flow for operation in the single mode desired.

Figure 3:
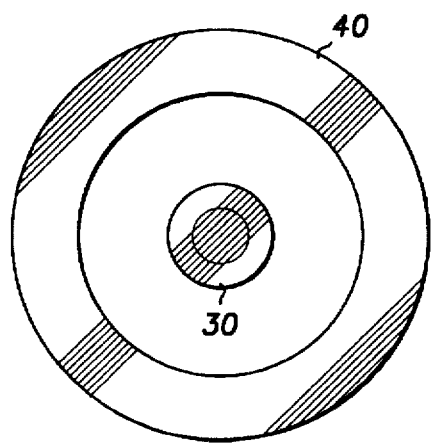
FIG. 3 is a simplified top plan view of one embodiment of the structure of FIG. 2.
Figure 4:
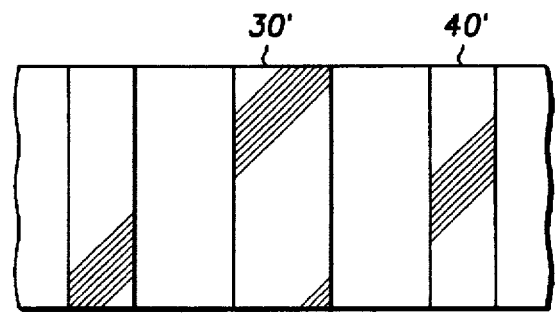
FIG. 4 is a simplified top plan view of another embodiment of the structure of FIG. 2.

Still referring to FIG. 2, a lateral detector 40 is formed around or adjacent VCSEL 30 and includes a first mirror stack 41, an active region 42, corresponding to active region 32, and a second mirror stack 44. In this embodiment, lateral detector 40 is integrated with VCSEL 30, and formed at the same time, i.e. first mirror stack 41, active region 42 and second mirror stack 44 are generally identical with first mirror stack 31, active region 32 and second mirror stack 37. An electrical contact 46 is formed in contact with at least the upper end of second mirror stack 44. A second electrical contact 48 is positioned over the lower surface of first mirror stack 41. Referring to FIG. 3, a simplified view in top plan of VCSEL 30 and lateral detector 40 is illustrated. Also, in FIG. 4 a simplified view in top plan of another embodiment is illustrated in which a laser 30' is an edge emitter and a detector 40' is spaced laterally therefrom.

For a more detailed description of an integrated laser device and lateral detector, a pending application filed of even date herewith, entitled " ", bearing attorney docket number CR95-199, and assigned to the same assignee is incorporated by reference. It will be readily understood by those skilled in the art that while a lateral detector is described in the preferred embodiment, substantially any detector capable of monitoring spontaneous emissions can be used.

During operation, VCSEL 30 generates spontaneous emissions that can be detected by lateral detector 40. By monitoring the spontaneous emissions from VCSEL 30, a change in the spatial mode VCSEL 30 is operating in can be determined. Carrier density in active region 32 is effectively clamped when VCSEL 30 is operated above threshold. The extent to which it is clamped is governed in part by the overlap of the photon field with the area of active region 32. When a laser device changes spatial mode the overlap of the photon field with the active region changes. This change in overlap results in either an increase or decrease in the volume of the active area that is clamped. To determine a mode change in the present disclosure, the photo current (spontaneous emission) of lateral detector 40 is measured as a function of drive current to VCSEL 30. Since the spontaneous emission above threshold is proportional to the ratio of the clamped/unclamped region of the active region, at a mode change the rate-of-change or slope of the spontaneous emission will change abruptly (i.e. a discontinuity in the slope occurs).

Figure 5:
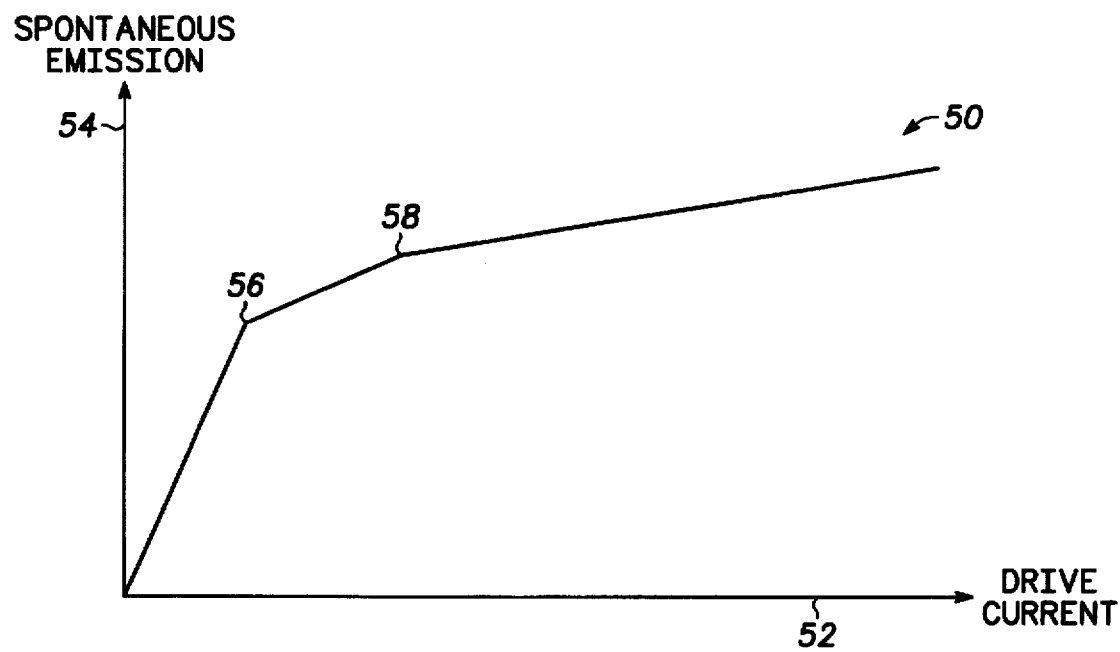
FIG. 5 is a graph illustrating the spontaneous emissions as a function of the drive current.

Referring to FIG. 5, a graph is illustrated showing a curve 50. Curve 50 represents the spontaneous emissions as a function of the drive current. The horizontal axis 52 designates drive current to VCSEL 30 and the vertical axis 54 designates the level of spontaneous emission or photo current in lateral detector 40. As can be seen, the slope of the curve has a first abrupt change, or discontinuity, 56 at threshold current, and a subsequent abrupt change, or discontinuity, 58 when the spatial mode changes. It is the detection of abrupt change 58 in the slope above the threshold current for which monitoring with detector 40 is employed.

Figure 6:
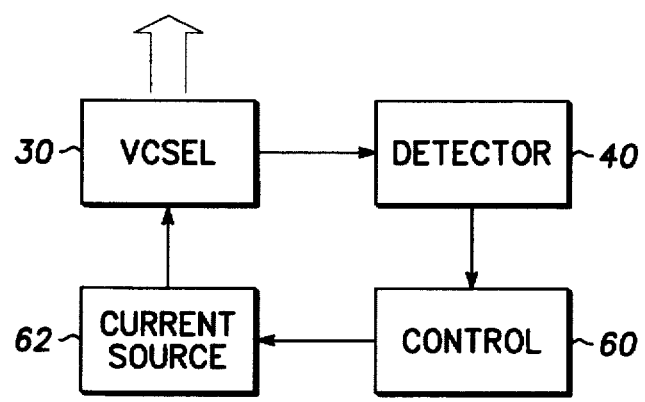
FIG. 6 is a simplified block diagram of a feedback control system.

Turning now to FIG. 6, the spatial mode of VCSEL 30 can be controlled by employing a feedback system. A control device 60 receives and processes the information monitored by lateral detector 40, and regulates the current employed to drive VCSEL 30 from a current source 62. Thus, knowledge of the conditions at which the mode changes, allows active feedback based on the spontaneous emission, to maintain operation of the laser in a single spatial mode.

While a VCSEL has been described throughout the description, it will be understood that the present invention can be used in combination with an edge emitting laser also. A detector would be positioned adjacent the laser to receive spontaneous emissions and determine an abrupt change therein as described above. Through use of feedback, the spatial mode can be controlled.

Thus, a method of determining a shift in the spatial mode of the output of a semiconductor laser has been provided. Also provide is a method for controlling the spatial mode of a semiconductor laser and a method of obtaining a single spatial mode output from a multi-mode semiconductor laser.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What we claim is:

1. A method of determining a shift in the spatial mode in which a semiconductor laser is operating comprising the steps of:

monitoring spontaneous emissions versus drive current of a semiconductor laser; and identifying a point above a threshold current at which the rate-of-change of the spontaneous emissions versus drive current abruptly changes.

2. A method as claimed in claim 1 wherein the step of monitoring includes monitoring lateral spontaneous emissions.

3. A method as claimed in claim 2 further including employing feedback to maintain spatial mode control, driven by the identification of the abrupt change in the spontaneous emissions versus drive current.

4. A method as claimed in claim 1 wherein the step of monitoring above threshold spontaneous emissions of a semiconductor laser includes calculating the spontaneous emission as a function of drive current to form a curve.

5. A method as claimed in claim 4 wherein the step of identifying the point at which the spontaneous emissions versus drive current abruptly change includes locating an abrupt change in the curve.

6. A method of controlling the spatial mode of the output of semiconductor laser comprising the steps of:

monitoring a rate-of-change of above threshold spontaneous emissions of a semiconductor laser as a function of drive current;

identifying a point at which the rate-of-change of the spontaneous emissions versus drive current abruptly changes; and employing feedback to maintain spatial mode control.

7. A method as claimed in claim 6 wherein the step of monitoring includes providing a detector positioned adjacent the semiconductor laser for receiving emitted spontaneous emissions from the semiconductor laser.

8. A method of controlling the spatial mode of the output of a vertical cavity surface emitting laser comprising the steps of:

providing a vertical cavity surface emitting laser;

positioning a lateral detector adjacent the vertical cavity surface emitting laser for receiving laterally emitted spontaneous emissions from the vertical cavity surface emitting laser at an above threshold current;

monitoring the above threshold spontaneous emissions of the vertical cavity surface emitting laser versus drive current of the vertical cavity surface;

identifying a point at which a rate-of-change of the spontaneous emissions versus drive current abruptly changes; and employing feedback to maintain spatial mode control.

9. A method as claimed in claim 8 wherein the step of employing feedback to maintain spatial mode control includes providing control means for receiving output from the lateral detector and controlling current to the vertical cavity surface emitting laser, the spontaneous emissions being a function of the current.

\* \* \* \* \*